United States Patent
Wu et al.

(10) Patent No.: US 10,510,684 B2
(45) Date of Patent: Dec. 17, 2019

(54) THREE DIMENSIONAL INTEGRATED CIRCUIT (3DIC) WITH SUPPORT STRUCTURES

(71) Applicant: Taiwan Semiconductor Manufacturing Co., Ltd., Hsin-Chu (TW)

(72) Inventors: Chih-Wei Wu, Zhuangwei Township (TW); Ying-Ching Shih, Hsinchu (TW); Szu-Wei Lu, Hsinchu (TW); Jing-Cheng Lin, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 96 days.

(21) Appl. No.: 15/911,765

(22) Filed: Mar. 5, 2018

(65) Prior Publication Data
US 2018/0197826 A1 Jul. 12, 2018

Related U.S. Application Data

(63) Continuation of application No. 15/389,738, filed on Dec. 23, 2016, now Pat. No. 9,929,109, which is a (Continued)

(51) Int. Cl.
*H01L 23/00* (2006.01)
*H01L 25/065* (2006.01)
(Continued)

(52) U.S. Cl.
CPC .......... *H01L 23/562* (2013.01); *H01L 23/145* (2013.01); *H01L 23/147* (2013.01);
(Continued)

(58) Field of Classification Search
CPC .... H01L 23/562; H01L 24/13; H01L 25/0657
(Continued)

(56) References Cited

U.S. PATENT DOCUMENTS

| 5,633,535 A | 5/1997 | Chao et al. |
| 2003/0060035 A1* | 3/2003 | Kimura .................. H01L 23/50 |
| | | 438/626 |

(Continued)

FOREIGN PATENT DOCUMENTS

| TW | I231023 | 4/2005 |
| TW | 201117341 | 5/2011 |
| TW | I371845 | 9/2012 |

OTHER PUBLICATIONS

Non-Final Office Action dated Jun. 2, 2015 for U.S. Appl. No. 14/079,736.
(Continued)

*Primary Examiner* — Raj R Gupta
(74) *Attorney, Agent, or Firm* — Eschweiler & Potashnik, LLC

(57) ABSTRACT

Some embodiments of the present disclosure relate to an integrated circuit. The integrated circuit has a first semiconductor die and a second semiconductor die. The first semiconductor die is bonded to the second semiconductor die by one or more bonding structures. A first plurality of support structures are disposed between the first semiconductor die and the second semiconductor die. The first plurality of support structures are spaced apart from the one or more bonding structures. The first plurality of support structures are configured to hold together the first semiconductor die and the second semiconductor die.

20 Claims, 13 Drawing Sheets

Related U.S. Application Data continuation of application No. 14/079,736, filed on Nov. 14, 2013, now Pat. No. 9,570,421.

(51) Int. Cl.
*H01L 25/00* (2006.01)
*H01L 23/14* (2006.01)
*H01L 23/48* (2006.01)
*H01L 23/498* (2006.01)
*H01L 23/31* (2006.01)

(52) U.S. Cl.
CPC ...... *H01L 23/481* (2013.01); *H01L 23/49816* (2013.01); *H01L 23/49827* (2013.01); *H01L 24/13* (2013.01); *H01L 24/81* (2013.01); *H01L 25/0657* (2013.01); *H01L 25/50* (2013.01); *H01L 23/3171* (2013.01); *H01L 23/3192* (2013.01); *H01L 24/11* (2013.01); *H01L 24/14* (2013.01); *H01L 24/16* (2013.01); *H01L 24/17* (2013.01); *H01L 24/32* (2013.01); *H01L 24/73* (2013.01); *H01L 24/92* (2013.01); *H01L 2224/0401* (2013.01); *H01L 2224/10135* (2013.01); *H01L 2224/11464* (2013.01); *H01L 2224/131* (2013.01); *H01L 2224/13012* (2013.01); *H01L 2224/13017* (2013.01); *H01L 2224/13022* (2013.01); *H01L 2224/13025* (2013.01); *H01L 2224/13082* (2013.01); *H01L 2224/13147* (2013.01); *H01L 2224/13155* (2013.01); *H01L 2224/13562* (2013.01); *H01L 2224/13582* (2013.01); *H01L 2224/13644* (2013.01); *H01L 2224/13664* (2013.01); *H01L 2224/1403* (2013.01); *H01L 2224/14181* (2013.01); *H01L 2224/16146* (2013.01); *H01L 2224/16235* (2013.01); *H01L 2224/17181* (2013.01); *H01L 2224/32145* (2013.01); *H01L 2224/32225* (2013.01); *H01L 2224/73204* (2013.01); *H01L 2224/81007* (2013.01); *H01L 2224/81139* (2013.01); *H01L 2224/81203* (2013.01); *H01L 2224/81815* (2013.01); *H01L 2224/92125* (2013.01); *H01L 2225/06513* (2013.01); *H01L 2225/06517* (2013.01); *H01L 2225/06541* (2013.01); *H01L 2225/06548* (2013.01); *H01L 2225/06555* (2013.01); *H01L 2225/06572* (2013.01); *H01L 2225/06582* (2013.01); *H01L 2924/10253* (2013.01); *H01L 2924/10271* (2013.01); *H01L 2924/1305* (2013.01); *H01L 2924/13091* (2013.01); *H01L 2924/1421* (2013.01); *H01L 2924/1431* (2013.01); *H01L 2924/1434* (2013.01); *H01L 2924/1437* (2013.01); *H01L 2924/157* (2013.01); *H01L 2924/1579* (2013.01); *H01L 2924/15311* (2013.01); *H01L 2924/15787* (2013.01); *H01L 2924/15788* (2013.01); *H01L 2924/3511* (2013.01); *H01L 2924/3512* (2013.01); *H01L 2924/37001* (2013.01)

(58) Field of Classification Search
USPC .......................................................... 257/621
See application file for complete search history.

(56) References Cited

U.S. PATENT DOCUMENTS

| | | | |
|---|---|---|---|
| 2006/0043603 A1* | 3/2006 | Ranade | H05K 3/3436 257/778 |
| 2009/0186447 A1 | 7/2009 | Mastromatteo | |
| 2009/0200663 A1* | 8/2009 | Daubenspeck | H01L 23/49811 257/737 |
| 2011/0108973 A1 | 5/2011 | Hsieh et al. | |
| 2012/0199981 A1 | 8/2012 | Jeong et al. | |
| 2013/0000967 A1 | 1/2013 | Lee et al. | |
| 2013/0256895 A1* | 10/2013 | Su | H01L 24/11 257/773 |
| 2016/0163666 A1* | 6/2016 | Yajima | H01L 24/08 257/773 |

OTHER PUBLICATIONS

Final Office Action dated Dec. 3, 2015 for U.S. Appl. No. 14/079,736.
Non-Final Office Action dated Apr. 22, 2016 for U.S. Appl. No. 14/079,736.
Notice of Allowance dated Sep. 26, 2016 for U.S. Appl. No. 14/079,736.
Non-Final Office Action dated Apr. 3, 2017 for U.S. Appl. No. 15/389,738.
Final Office Action dated Aug. 22, 2017 for U.S. Appl. No. 15/389,738.
Notice of Allowance dated Nov. 16, 2017 for U.S. Appl. No. 15/389,738.

* cited by examiner

THREE DIMENSIONAL INTEGRATED CIRCUIT (3DIC) WITH SUPPORT STRUCTURES

REFERENCE TO RELATED APPLICATIONS

This Application is a Continuation of U.S. application Ser. No. 15/389,738 filed on Dec. 23, 2016, which is a Continuation of U.S. application Ser. No. 14/079,736 filed on Nov. 14, 2013 (now U.S. Pat. No. 9,570,421 issued on Feb. 14, 2017). The contents of the above-referenced matters are hereby incorporated by reference in their entirety.

BACKGROUND

Integrated circuits have experienced continuous rapid growth due to constant improvements in an integration density of various electronic components (i.e., transistors, diodes, resistors, capacitors, etc.). For the most part, this improvement in integration density has come from repeated reduction in minimum feature size, allowing more components to be integrated into a given chip area.

The volume occupied by the integrated components is near the surface of the semiconductor wafer. Although dramatic improvements in lithography have resulted in considerable improvement in two-dimensional (2D) integrated circuit formation, there are physical limitations to an achievable density in two dimensions. One of these limitations is the minimum size needed to make the integrated components. Further, when more devices are put into one chip, more complex designs are required. An additional limitation comes from the significant gains in the number and length of interconnections between devices as the number of devices increases. When the number and length of interconnections increase, both circuit RC delay and power consumption increase.

Three-dimensional integrated circuits (3DIC) were thus proposed, wherein dies are stacked, with wire-bonding, flip-chip bonding, and/or through-silicon vias (TSV) being used to stack the dies together and to connect the dies to package substrates.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION

Figure 1:
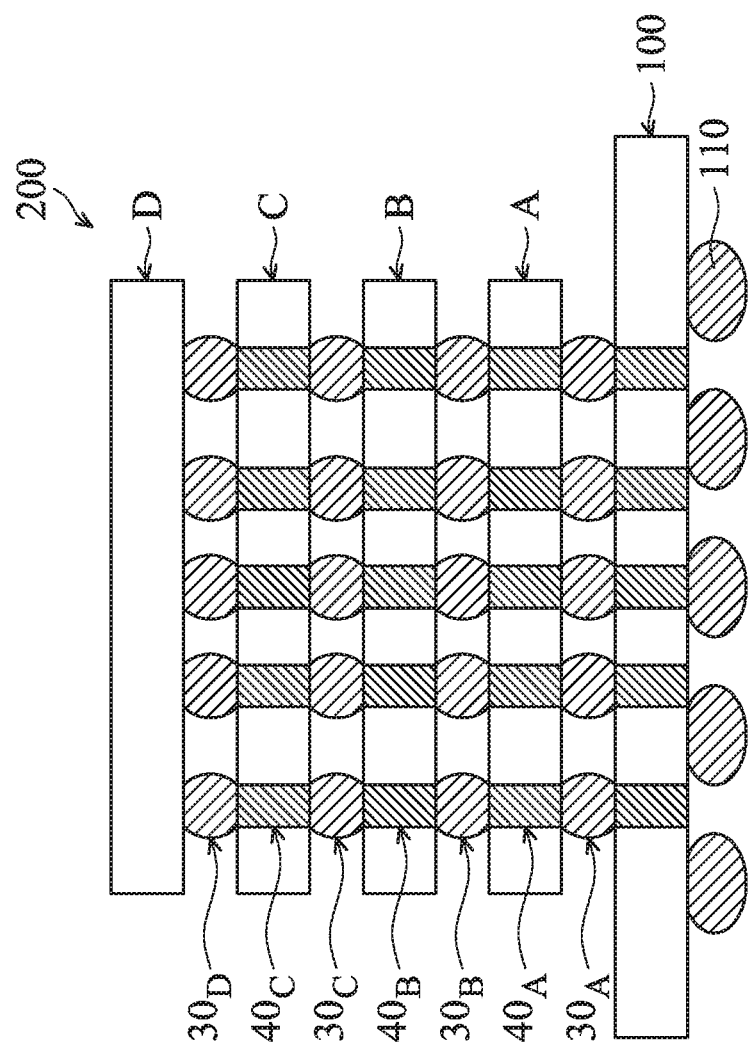
FIG. 1 is a cross-sectional view of a three-dimensional integrated circuit (3DIC) structure, in accordance with some embodiments.

It is to be understood that the following disclosure provides many different embodiments, or examples, for implementing different features. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a cross-sectional view of a three-dimensional integrated circuit (3DIC) structure 200, in accordance with some embodiments. 3DIC structure 200 includes semiconductor dies A, B, C, and D stacked on top of one another on a substrate 100. Each of the semiconductor dies A, B, and C has one or more through silicon vias (TSVs) $40_A$, $40_B$, or $40_C$, for inter-die communications and heat dissipation. The TSVs $40_A$, $40_B$, and $40c$ are connected to other TSVs or substrate 100 through bonding structures $30_A$ $30_B$, $30_C$, and $30_D$ in semiconductor dies A, B, C, and D, respectively, which could be electrically connected to integrated circuits (not shown) in each die. In some embodiments, the bonding structures $30_A$ $30_B$, $30_C$, and $30_D$ include various types of metal, such as solder, gold, copper, etc. Substrate 100 also includes external connectors 110. The width of substrate 100 is wider than the widths of each of semiconductor dies A, B, C, and D.

Each semiconductor die includes a semiconductor substrate as employed in a semiconductor integrated circuit fabrication, and integrated circuits may be formed therein and/or thereupon. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices. In some embodiments, each semiconductor die also includes passive devices such as resistors, capacitors, inductors and the like.

Each semiconductor die may include interconnect structures or redistribution layer(s) (RDL) (not shown) to enable electrical connection between interconnect in each die and external connectors. RDLs are interconnect structures near a surface of die packages or on packaging structures to facilitate electrical connections. Dies, such as dies A, B, and C, between top die D and substrate 100 may further include through substrate vias (TSVs) and may be interposers.

Substrate 100 may be made of a semiconductor wafer, or a portion of wafer. In some embodiments, substrate 100 includes silicon, gallium arsenide, silicon on insulator ("SOI") or other similar materials. In some embodiments, substrate 100 also includes passive devices such as resistors, capacitors, inductors and the like, or active devices such as transistors. In some embodiments, substrate 100 includes additional integrated circuits. In addition, the substrate 100 may be made of other materials. For example, in some embodiments, substrate 100 is a multiple-layer circuit board. In some embodiments, substrate 100 also includes bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals.

To form the 3DIC structure 200 in FIG. 1, dies A, B, C, and D are stacked over substrate 100 and then undergo a reflow process to form the bonding structures $30_A$ $30_B$, $30_C$, and $30_D$. In some embodiments, some or all of semiconductor dies A, B, C, and D bow before or after the reflow process used to form bonding structures $30_A$ $30_B$, $30_C$, and $30_D$. The bowing of a die is caused by a mis-match of coefficients of thermal expansion (CTE) and stress of various layers in the die. During the formation of devices and structures of dies on a substrate, films with different CTE and stress are formed on the substrate. The substrate also undergoes different thermal processes during the formation of the devices and structure. After the formation of devices and structures are completed, dies formed on the substrate are separated into individual pieces, such as semiconductor dies A, B, C, and D. The separated and individual dies could bow due to mis-match of coefficients of thermal expansion (CTE) and stress of various layers in the die.

Figure 2A:
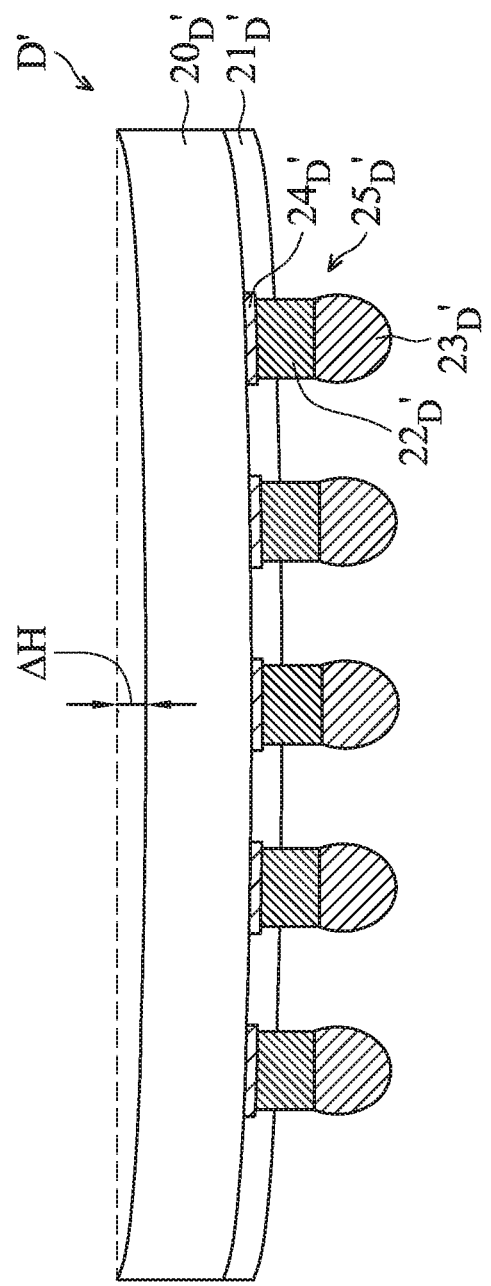
FIG. 2A is a cross-sectional view of a die, in accordance with some embodiments.

FIG. 2A is a cross-sectional view of a die D', in accordance with some embodiments. Die D' is similar to semiconductor die D and includes a substrate $20_D$' with devices (not shown) and interconnect structures (not shown) formed therein. Die D' has connecting structures $25_D$'. Each connecting structure $25_D$' includes a copper post $22_D$' and a solder layer $23_D$' formed over the copper post $22_D$'. The copper post $222_D$' comes in contact with a metal pad $24_D$', which is connected to interconnect structures (not shown) and devices (not shown) in die D'. In some embodiments, an under bump metallurgy (UBM) layer (not shown) is between copper post $22_D$' and the metal pad $24_D$'. The structure of a connecting structure $25_D$' described above is merely an example. Other connecting structures may also be used.

A passivation structure $21_D$' is formed over substrate $20_D$' to protect substrate $20_D$'. The passivation structure $21_D$' may include one or more passivation layers. The passivation layer(s) is made of silicon nitride, silicon oxynitride, polymers, or combinations thereof, in some embodiments. Die D' may or may not have has TSVs. In some embodiments where die D' is a top die, die D' does not have TSVs. In some embodiments where die D' is a die between a top die and a substrate, die D' has TSVs.

Figure 2B:
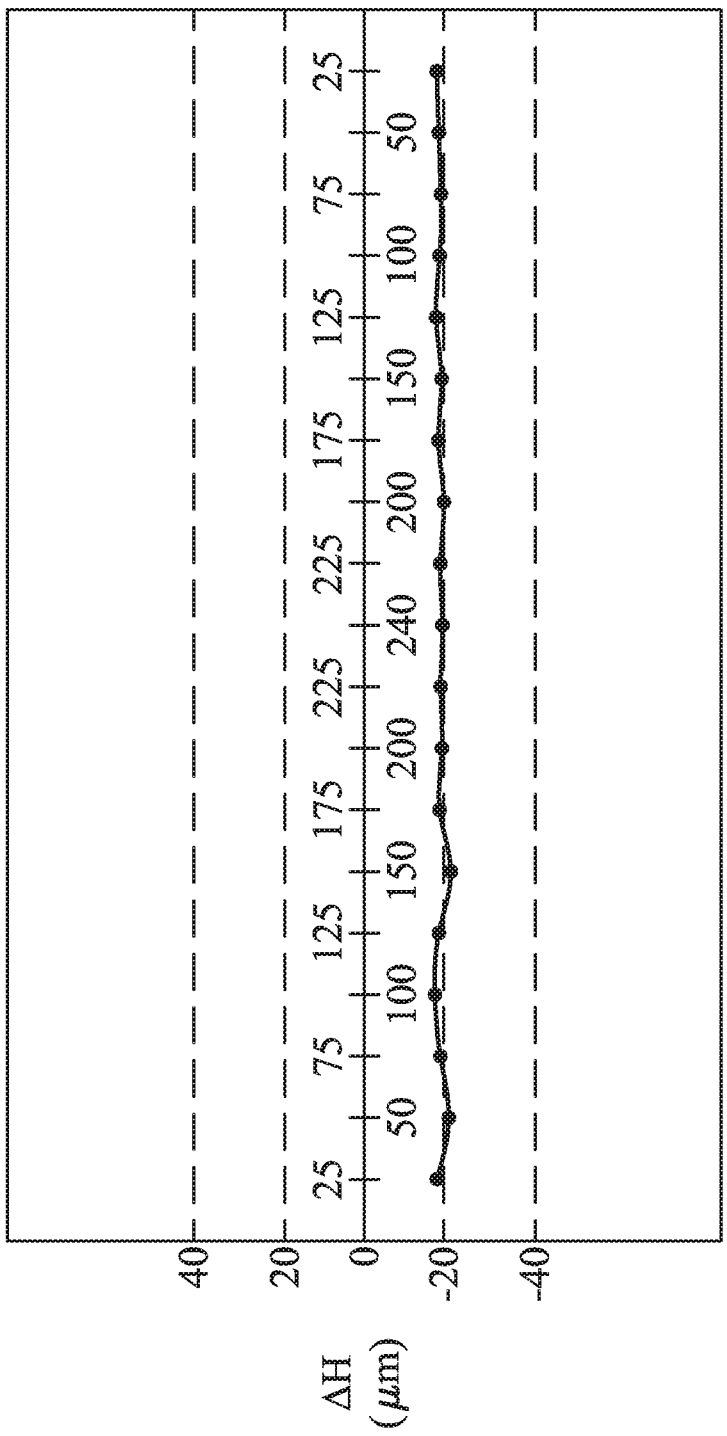
FIG. 2B is a diagram the warpage of a die with temperatures of a thermal cycling of the die of FIG. 2A, in accordance with some embodiments.

As shown in FIG. 2A, die D' bows upward at the edges. As a result, die D' has a crescent cross-sectional shape. For a lead-free bump scheme, the reflow process for forming bonding structures is performed at a peak temperature in a range from about 230° C. to about 250° C., in accordance with some embodiments. To understand the effect of a thermal process, such as reflow, on the planarity (or flatness) of dies, in a non-limiting example, die D' undergoes a thermal cycling with temperature rising from room temperature (25° C.) to 240° C. and back to room temperature (25° C.). FIG. 2B is a diagram of the warpage of die D' with temperatures of the thermal cycling, in accordance with some embodiments. The die warpage ΔH is defined as a difference of heights between a top surface at a center of die and a top surface at an edge of die. For example, a warpage of −20 μm for a die means the edges of the die are higher than the center of the die by 20 μm. FIG. 2B indicates that the die warpages for die D' stay consistently at about −20 μm during the thermal cycling. The data in FIG. 2B indicate that die D' bows upward at the edges under various temperatures of the thermal cycling. The shape of die D' with edges higher than center of die resembles a crescent shape, as in FIG. 2A.

Figure 3A:
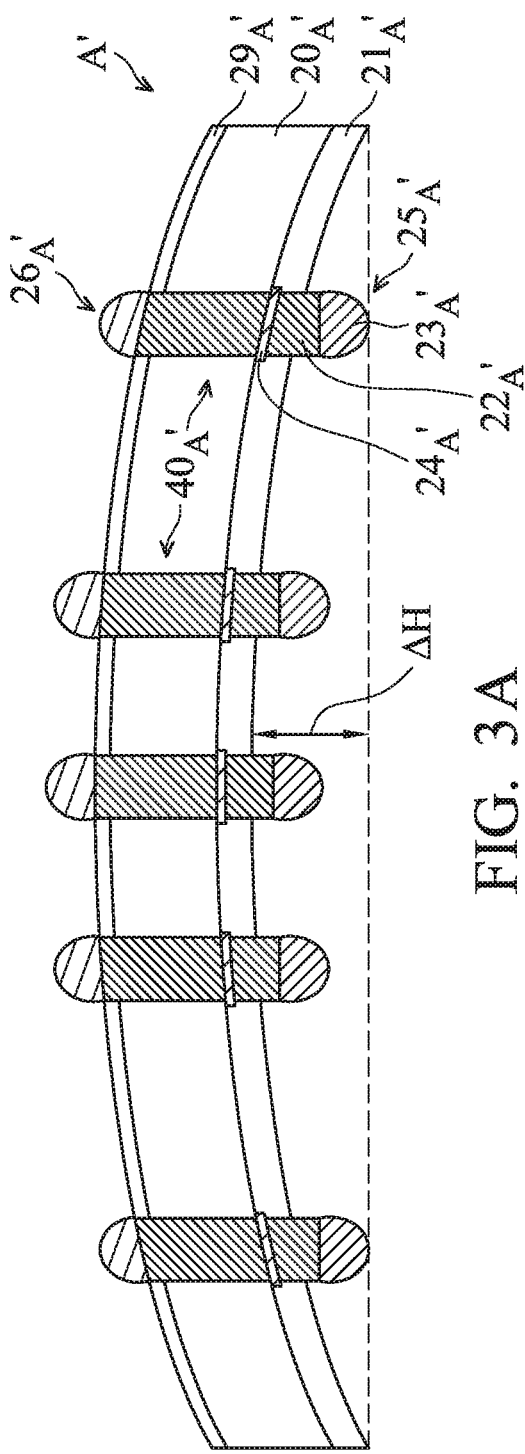
FIG. 3A is a cross-sectional view of a die, in accordance with some embodiments.

FIG. 3A is a cross-sectional view of die A', in accordance with some embodiments. Die A' is similar to die A (FIG. 1), and includes a substrate $20_A$' with devices (not shown) and interconnect structures (not shown) formed therein. Die A' also has TSVs $40_A$' and also connecting structures $25_A$'. Each connecting structure $25_A$' includes a copper post $22_A$' and a solder layer $23_A$' formed over the copper post $22_A$'. The copper post $22_A$' comes in contact with a metal pad $24_A$', which is connected to TSV $40_A$'. In some embodiments, an under bump metallurgy (UBM) layer (not shown) is between copper post $22_A$' and metal pad $24_A$'. A passivation structure $21_A$' is formed over substrate $20_A$' to protect substrate $20_A$'. The passivation structure $21_A$' is similar to passivation structure $21_D$' and may include one or more passivation layers. The other end of TSV $40_A$' is connected to another connecting structure $26_A$'. In some embodiments, a passivation structure $29_A$' is formed over a backside of substrate $20_A$' opposite passivation layer $21_A$', as in FIG. 3A. The passivation structure $29_A$' may include one or more passivation layers. The passivation layer(s) is made of silicon nitride, silicon oxynitride, polymers, or combinations thereof, in some embodiments.

Figure 3B:
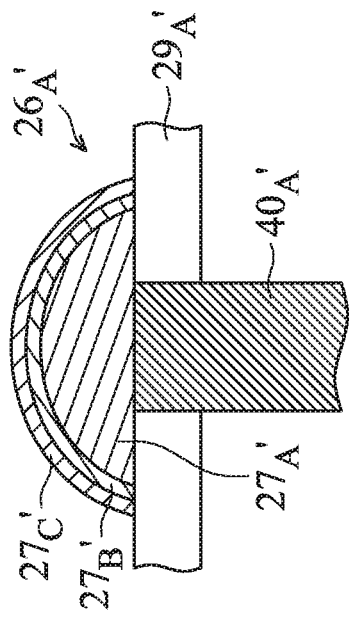
FIG. 3B is a cross-sectional view of a connecting structure on a die of FIG. 3A, in accordance with some embodiments.

In some embodiments, each connecting structure $26_A$' includes a nickel (Ni) layer $27_A$', a palladium (Pd) layer $27_B$', and a gold (Au) layer $27_C$', as in FIG. 3B. In some embodiments, the connecting structure $26_A$' are made of electroless Ni, electroless Pd, and immersion Au (or electroless-Ni/ electroless-Pd/immersion-Au, or ENEPIG). Connecting structures using ENEPIG layers are used for bonding and are lead-free (Pb-free).

Figure 3C:
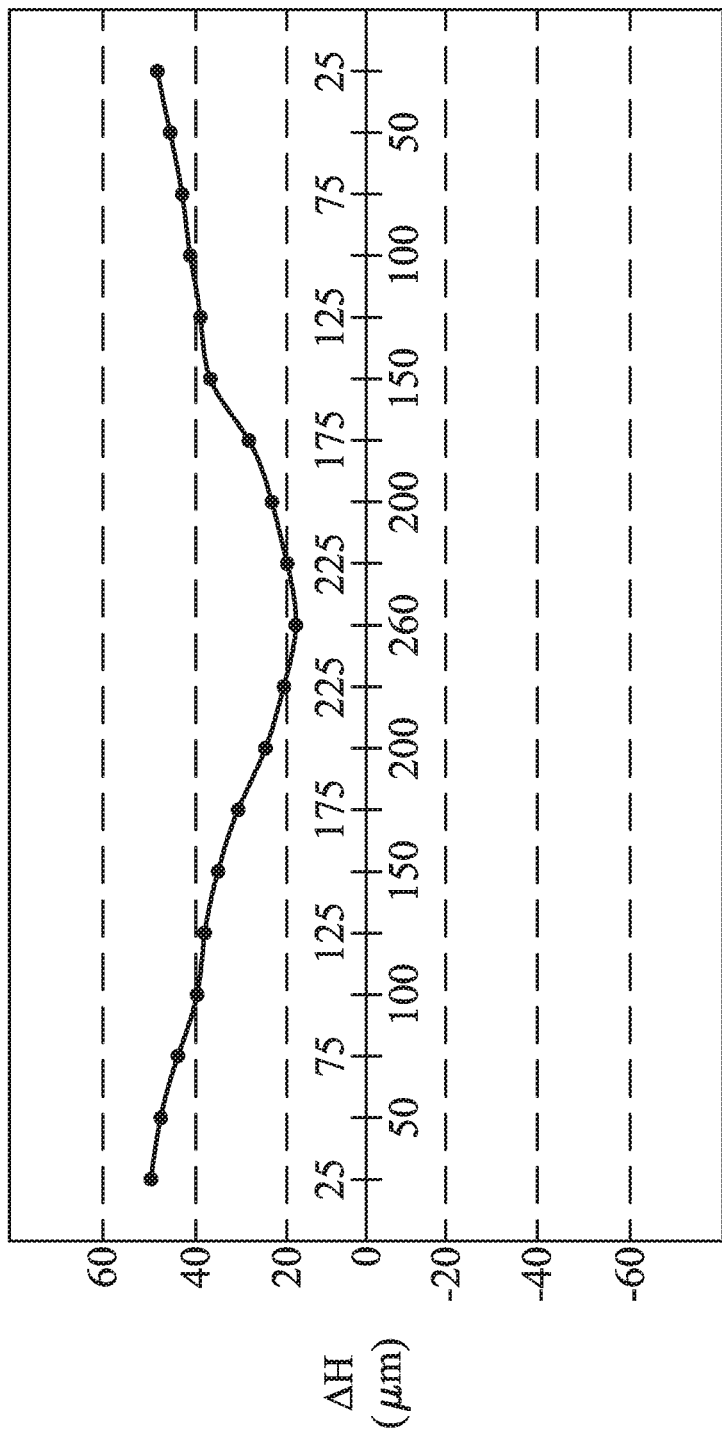
FIG. 3C is a diagram the warpage of a die with temperatures of a thermal cycling of the die of FIG. 3A, in accordance with some embodiments.

To understand the effect of a thermal process on the planarity (or flatness) of dies, in a non-liming example, die A' undergoes a thermal cycling with temperature rising from room temperature (25° C.) to 260° C. and back to room temperature (25° C.). FIG. 3C is a diagram of the warpage (ΔH) of die A' with temperatures of the thermal cycling, in accordance with some embodiments. FIG. 3C indicates that the die warpage stay consistently at about 50 μm at room temperature and decrease to about 17 μm at 260° C. The warpage recovers to about 50 μm when the temperature cycles back to room temperature. The data in FIG. 3C indicate that die A' bows downward at the edges during the various temperatures of thermal cycling. The shape of die A' with edges lower than a center of the die resembles a downward facing crescent shape.

Figure 4:
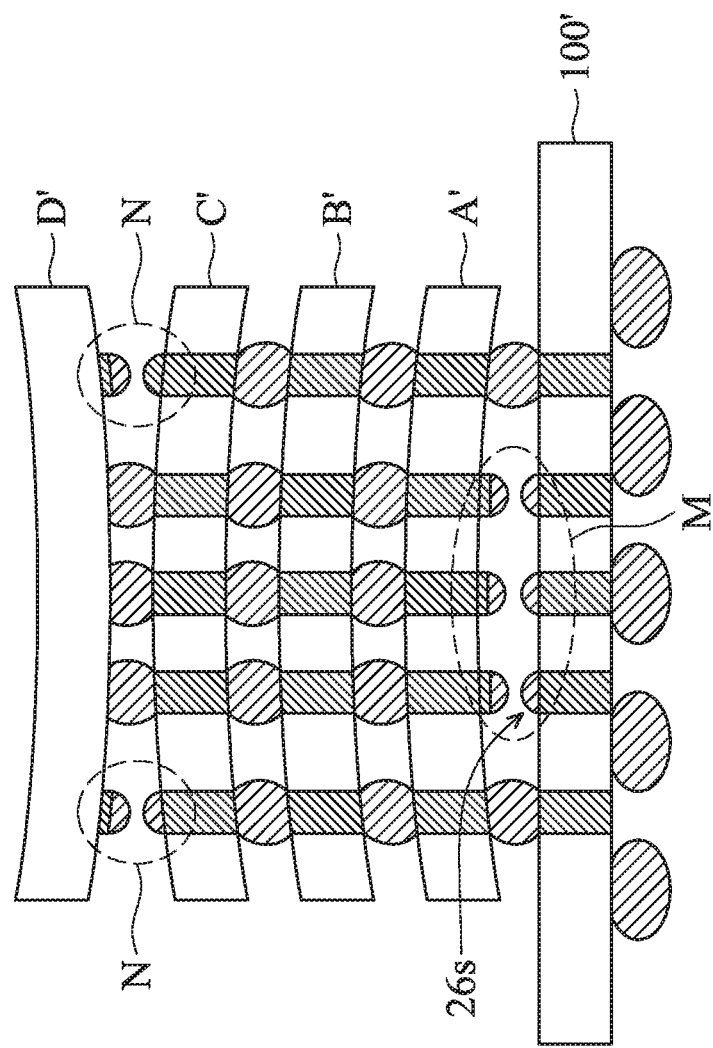
FIG. 4 is a cross-sectional view of dies stacked over a substrate, in accordance with some embodiments.

FIG. 4 is a cross-sectional view of dies A', B', C', and D' stacked over substrate 100' after reflow and at room temperature, in accordance with some embodiments. Dies B' and C' are similar to die A' and also bow downward at the edges. Substrate 100' is similar to substrate 100. In some embodiments, substrate 100' is a wafer and is substantially planar. Due to the bowing of dies A', B', C', and D', bonding structures in region M and regions N are likely to have cold joints (open joints). Region M is near a center of substrate 100'. The center portion of die A' is pulled away from the connectors $26_S$ on substrate 100'. As a result, region M could have open or cracked bonding structures between substrate 100' and die A' after reflow due to bowing of die A'. Regions N are near the edges of dies D' and C'. Due to the upward bowing of die D' and the downward bowing of die C' at edges, the bonding structures between dies D' and C' near regions N are likely to have opens or cracks. Bonding structures with opens or cracks would cause yield reduction.

In order to reduce the effect of bowing, thermal compression bonding process may be used. Thermal compression bonding involves applying external pressure on the stacked dies and substrate during a thermal process. The pressure reduces the effect of bowing. However, the processing is costly and bonding structures near high stress regions, such as regions M and N, still have a risk of cracking. Therefore, finding a mechanism for bonding multiples dies on a substrate that reduces the effect of bowing of dies is desirable.

Figure 5A:
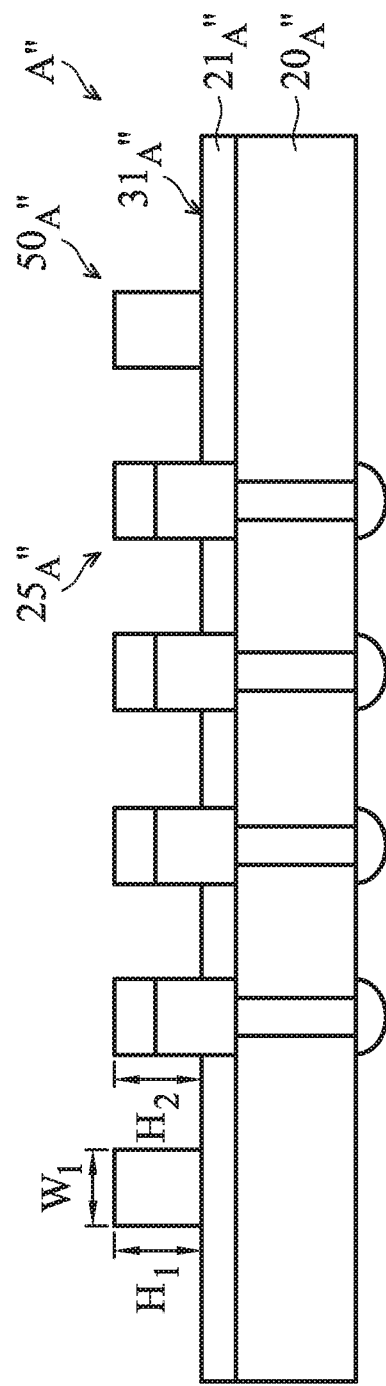
FIG. 5A is a cross-sectional view of a die, in accordance with some embodiments.

FIG. 5A is a cross-sectional view of die A" with support structures $50_A$" formed on a side of die A" with connecting structures $25_A$", in accordance with some embodiments. The supportive structures $50_A$" are formed on a surface $31_A$" of die A" not occupied by connecting structures $25_A$". The support structures $50_A$" are formed next to or near the connecting structures $25_A$". A height $H_1$ of support structure $50_A$" is about the same as a height $H_2$ of connecting structures $25_A$" above surface $31_A$" (or surface of passivation structure $21_A$"), in some embodiments. In some embodiments, $H_1$ is greater than $H_2$. The support structures $50_A$" include polymers and adhere to the surface $31_A$" of passivation structure $21_A$". In some embodiments, a width $W_1$ of a support structure 50A" is in a range from about 20 μm to about 500 μm.

In some embodiments, support structures $50_A$" are made of polymers with fillers, such as silica and/or rubber. The fillers are used to provide (or enhance) strength to the support structures $50_A$", which are placed between two dies. The examples of polymer(s) used for the support structures $50_A$" include, but are not limited to, materials such as polyimide, polybenzoxazole (PBO), or benzocyclobutene (BCB). The polymer used for support structures $50_A$" soften and melt under reflow of bonding structures and adhere to a substrate bonded to die A". In some embodiments, a glass transition temperature of support structures $50_A$" is in a range from about 40° C. to about 150° C. After the thermal reflow process with die A" and substrate 100" returning to room temperature, the support structures $50_A$" maintain sufficient strength to maintain the height between die A" and the substrate. In some embodiments, a Young's modulus of support structures $50_A$" is in a range from about 1 GPa to about 10 GPa.

Figure 5B:
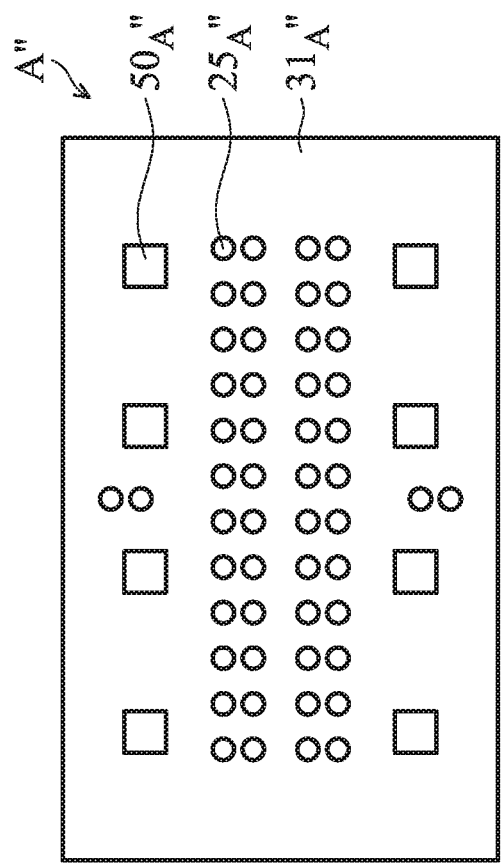
FIG. 5B is a top view of the die of FIG. 5A, in accordance with some embodiments.
Figure 5C:
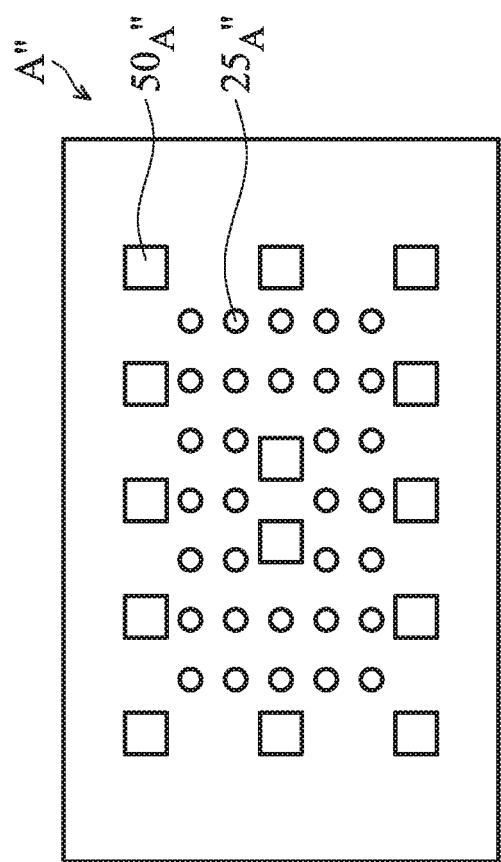
FIG. 5C is a top view of supporting structures and connecting structures on a die, in accordance with some other embodiments.

FIG. 5B is a top view of die A" with support structures $50_A$" formed over surface $31_A$", in accordance with some embodiments. The support structures $50_A$" are distributed across surface $31_A$" of die A" and are formed on surface $31_A$" not occupied by connecting structures $25_A$". Since there is limited surface space near the center of die A", support structures $50_A$" are arranged mostly surrounding connecting structures $25_A$" which are congregated near the center of die A". If the connecting structures are arranged differently, the support structures $50_A$" are re-arranged accordingly. FIG. 5C is a top view of die A" with supporting structures $50_A$" and connecting structures $25_A$" on surface $31_A$", in accordance with some embodiments. The connecting structures $25_A$" are arranged around an outer portion of surface $31_A$". Some support structures $50_A$" are placed near the center of die A" and others are place near outer edges of die A".

The support structures $50_A$" are placed at various locations across the surface ($31_A$") of die A" to counter the effect of bowing. In some embodiments, the placement of the support structures $50_A$" is based on the bowing of the two dies or substrates that the support structures are sandwiched between.

Figure 5D:
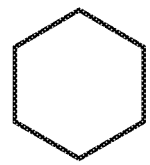
FIG. 5D are top views of various shapes of a support structure, in accordance with some embodiments.
Figure 5D:
Figure 5D:
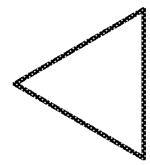
Figure 5D:
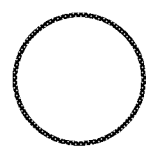
Figure 5D:
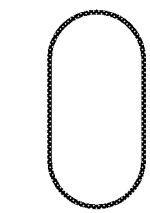

The support structures $50_A$" in FIGS. 5B and 5C have cross sections in the shapes of squares. However, the support structures $50_A$" are in other shapes, in some embodiments. FIG. 5D are top views of a support structure $50_A$" having oval, circle, triangle, rectangle, and hexagon shapes. Other shapes are also possible.

Support structures $50_A$" may be formed on the surface $31_A$" of substrate $20_A$" by various methods. In some embodiments, passivation layer $21_A$" is over substrate $20_A$" and support structures $50_A$" are formed on surface $31_A$" on top of the passivation layer. For example, structures $50_A$" may be formed by printing (or screening) with a stencil. During the printing (or screening) process, the support structures $50_A$" or substrate $20_A$" are heated to allowed the support structures $50_A$" to adhere to surface $31_A$" of substrate $20_A$".

Alternatively, a layer for material for the support structures $50_A$" may be deposited on surface $31_A$" of substrate $20_A$" prior to forming support structures. After the layer of material is deposited, the layer is than patterned by lithography and etched. Other applicable methods may also be used to form support structures $50_A$".

Figure 6A:
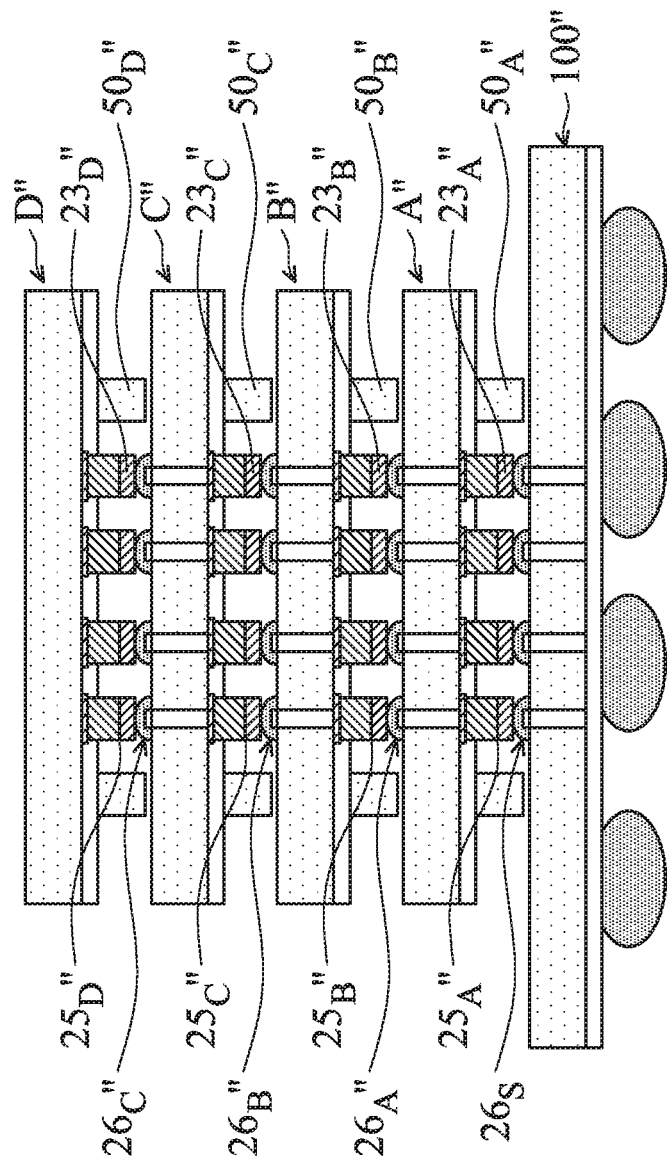
FIG. 6A is cross-sectional view of 3 dies and a substrate for forming a three dimensional integrated circuit (3DIC) structure before a reflow process, in accordance with some embodiments.

FIG. 6A is cross-sectional view of 3 dies and a substrate for forming a three dimensional integrated circuit (3DIC) structure before a reflow process, in accordance with some embodiments. Support structures similar to support structures $50_A$" may also formed on dies B", C", and D" by similar mechanisms described above. Dies A", B", C", and D" are similar to dies A', B', C', and D', respectively. After support structures $50_A$", $50_B$", $50_C$", and $50_D$" are on formed on dies A", B', C', and D', these dies are stacked on top of each other over substrate 100", as in FIG. 6A in accordance with some embodiments. The connecting structures $25_A$" are aligned with and connecting structures $26_S$ of substrate 100". Support structures $50_A$" on die A" are between die A" and substrate 100". Similarly, connecting structures $25_B$" of substrate B" are aligned connecting structures $26_A$" on the opposite side of substrate A" from connecting structures $25_A$". Support structures $50_B$" formed on die B" are between die B" and die A".

Similarly, connecting structures $25_C$" of substrate C" are aligned with connecting structures $26_B$" and support structures $50_C$" are between die C" and die B". Connecting structures $25_D$" of substrate D" are aligned with connecting structures $26_C$" and support structures $50_D$" are between die D" and die C".

Figure 6B:
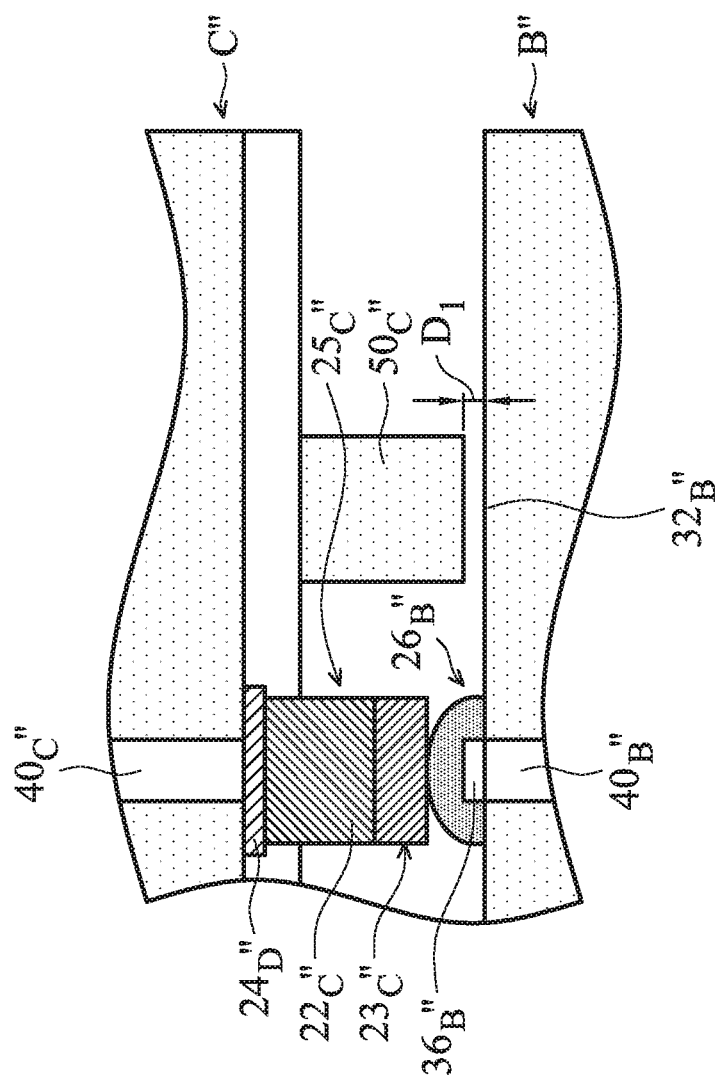
FIG. 6B is a cross-sectional view of a support structure of a die next to a connecting structure aligned with a connecting structure of another die, in accordance with some embodiments.

FIG. 6B is an enlarged cross-sectional view of a support structure $50_C$" on die C" next to a connecting structure $25_C$" aligned with and in contact with a connecting structure $26_B$" of die B", in accordance with some embodiments. FIG. 6B includes a gap with a distance $D_1$ between support structure $50_C$" and a surface $32_B$" of die B". In some embodiments, the support structure $50_C$" touches surface $32_B$". To provide support for the 3DIC with dies A", B", C", D", over substrate 100", the support structure 50C" adheres to surface $32_B$" after reflow. $D_1$ is in a range from about 0 nm to about 2000 nm, in accordance with some embodiments. $D_1$ can be greater than zero, because solder layer $23_C$" of die C" softens and melts to cover at least a portion of connecting structure $26_B$". In some embodiments, connecting structure $26_B$" is formed over a metal pad $36_B$". Due to the softening and melting of solder layer $23_C$", a height of solder layer $23_C$" between copper post $22_C$" and connecting structure $26_B$" is shortened from a pre-reflow height, which allows support structure $50_C$" to touch surface $32_B$" and become adhered to surface $32_B$".

Figure 7A:
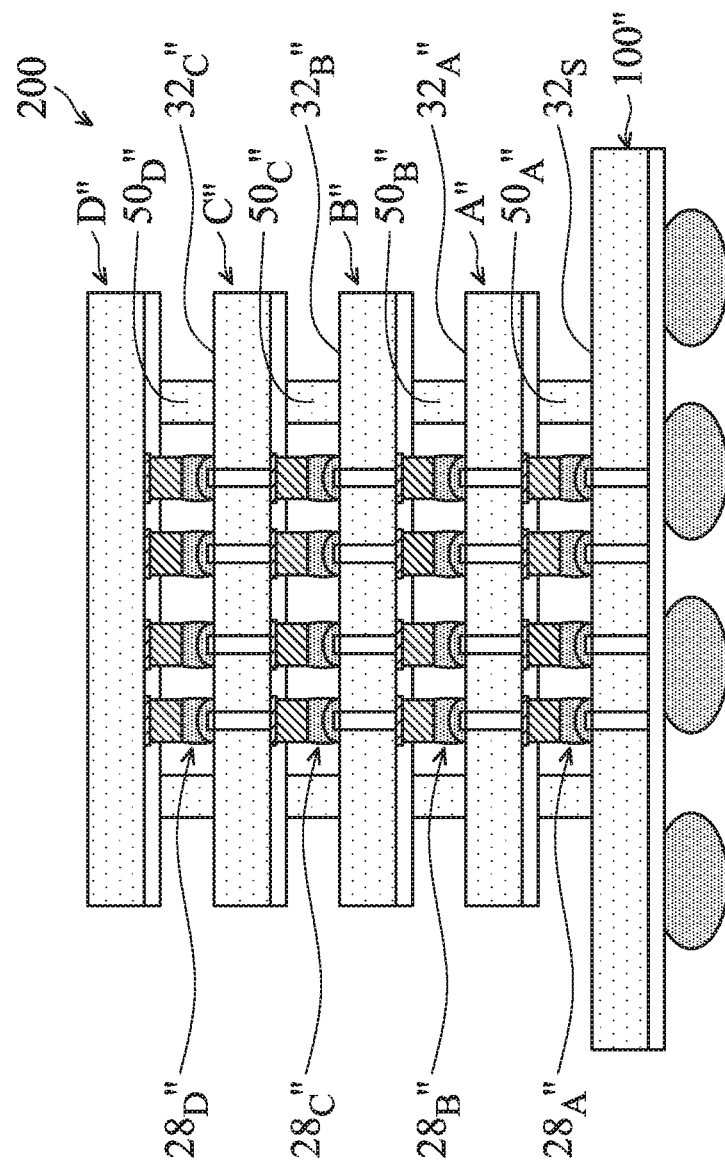
FIG. 7A is a cross-sectional view of a 3DIC structure, in accordance with some embodiments.

FIG. 7A is a cross-sectional view of a 3DIC structure, in accordance with some embodiments. After dies A", B", C" and D" are stacked over substrate 100", the stacked structure undergoes a reflow process. The reflow process enables the solder layers $23_A$", $23_B$", $23_C$" and $23_D$" to bond to connecting structure $26_S$, $26_A$", $26_B$", and $26_C$" respectively to form bonding structures $28_A$", $28_B$", $28_C$" and $28_D$", as in FIG. 7A, in accordance with some embodiments. The bonded dies A", B", C", D" and substrate 100' form a 3DIC structure 200". The reflow process also bonds support structures $50_D$" to the back surface $32_C$" of die C", support structures $50_C$" to the back surface $32_B$" of die B", support structures $50_B$" to the back surface $32_A$" of die A", and support structures $50_A$" to the back surface $32_S$ of substrate 100".

The reflow process is conducted at a peak temperature in a range from about 230° C. to about 250° C., in accordance with some embodiments. For example under the reflow process, the polymer material of the support structures $50_D$" softens and adheres to surface $32_C$". One end of each of support structures $50_D$" adheres to surface $31_C$" of die D" and the other end of the same support structure $50_D$" adheres to surface $32_C$" of die C". As mentioned above, the support structures $50_D$" include fillers used to increase strength of the support structures. Heights of the support structures $50_D$" are maintained during the reflow process to keep the distance between dies D" and C".

Figure 7B:
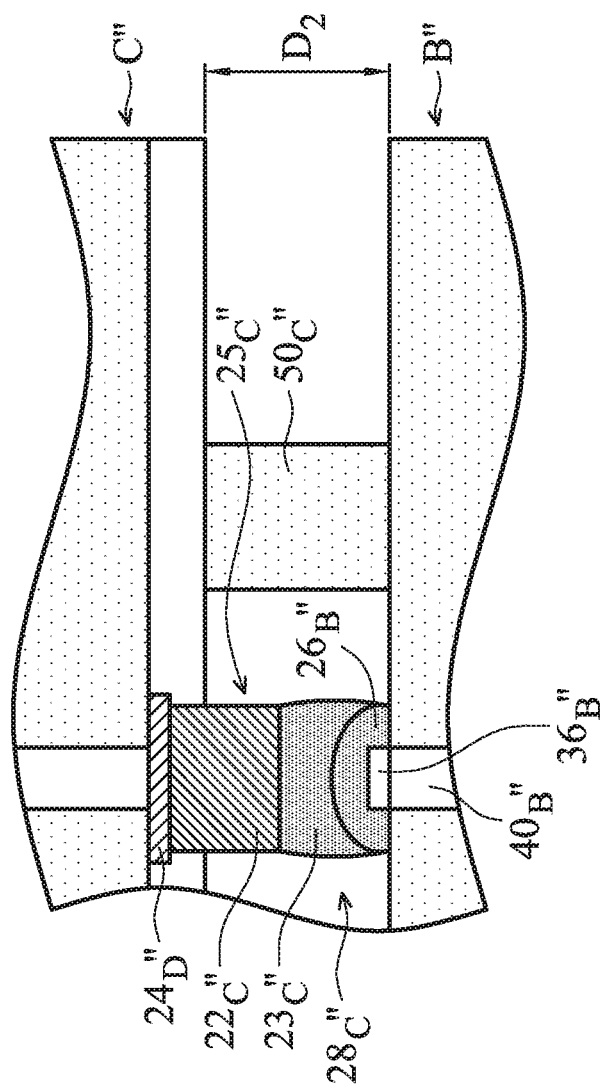
FIG. 7B is a cross-sectional view of a support structure next to a bonding structure between on two dies, in accordance with some embodiments.

FIG. 7B is an enlarged cross-sectional view of a support structure $50_C$" next to a bonding structure $28_C$" between on dies C" and B", in accordance with some embodiments. A height $D_2$ of support structures $50_C$" is in a range from about 10 μm to about 50 μm.

The support structures $50_C$" also relieve stress exerted on bonding structures $28_C$" between dies C" and B" and reduces the risk of cracking of bonding structures. The Young's Modulus of the support structures $50_C$" helps to relieve stress exerted on bonding structures $28_C$" by absorbing forces associated with bowing of dies B" and C" during formation of the dies. As a result, support structures $50_C$" improve the yield of the 3DIC structure 200" of bonded dies A", B", C", D" and substrate 100", in comparison with a 3DIC which does not include support structures $50_C$". Support structures $50_D$", $50_B$" and $50_A$" provide similar function as structures 50c".

Figure 8:
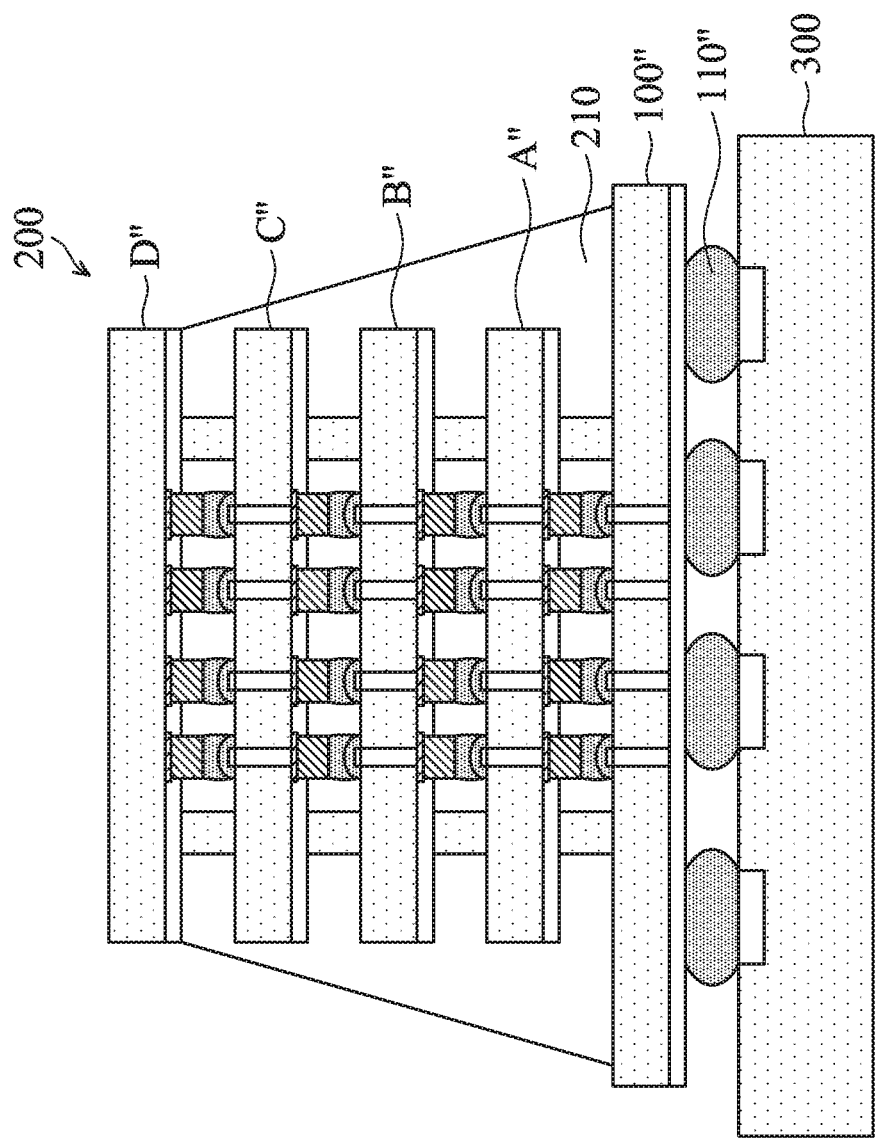
FIG. 8 is a cross-sectional view of a 3DIC structure, in accordance with some embodiments.

FIG. 8 is a cross-sectional view of a 3DIC structure, in accordance with some embodiments. After the 3DIC structure 200" has been formed, an underfill 210 can be applied on the surface of substrate 100" to fill the space between substrate 100" and dies A", B", C", and D", as in FIG. 8 in accordance with some embodiments. The 3DIC structure 200" with the underfill is bonded to another substrate 300 via external connectors 110", as in FIG. 8.

Substrate 300 may be made of a semiconductor wafer, or a portion of wafer. In some embodiments, substrate 100 includes silicon, gallium arsenide, silicon on insulator ("SOI") or other similar materials. In some embodiments, substrate 300 also includes passive devices such as resistors, capacitors, inductors and the like, or active devices such as transistors. In some embodiments, substrate 300 includes additional integrated circuits. In addition, the substrate 300 may be made of other materials. For example, in some embodiments, substrate 300 is a multiple-layer circuit board. In some embodiments, substrate 300 also includes bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals.

In 3DIC structure, such as structure 200", the numbers of support structures between different dies and/or between a die and a substrate could be the same or different. The layouts and designs of the support structures are based on the shapes and severity of bowing of the dies and substrate(s). The bowing shapes of dies A, B, C, and D described above are merely examples. Support structures $50_A$", $50_B$", $50_C$", and $50_D$" described above may be used to relieve stress and to help maintaining height between two neighboring dies with different bowing shapes from those described above.

The embodiments described above provide methods and structures for forming support structures between dies and substrate(s) of a 3DIC structures. Each support structure adheres to surfaces of two neighboring dies or die and substrate to relieve stress caused by bowing of the die(s) and/or substrate on the bonding structures formed between the dies or die and substrate. A cost of the support structures is much lower than other processes, such as thermal compression bonding, to reduce the effect of bowing of dies and substrates on 3DIC formation. The support structures improves yield of 3DIC structures.

In some embodiments, the present disclosure relates to a three dimensional integrated chip (3DIC) structure. The 3DIC structure comprises a first die and a second die that is bonded to the first die by one or more bonding structures. The one or more bonding structures respectively comprise a first metal pad arranged on the first die and a second metal pad arranged on the second die. A first plurality of support structures are disposed between the first die and the second die. The first plurality of support structures comprise polymers laterally spaced apart from a closest one of the one or more bonding structures. The first plurality of support structures extend below an upper surface of the second metal pad.

In some other embodiments, the present disclosure relates to a three dimensional integrated chip (3DIC) structure. The 3DIC structure comprises a first die and a second die that is bonded to the first die by a plurality of bonding structures. The plurality of bonding structures respectively comprise a copper post. A first plurality of support structures are disposed between the first die and the second die. The first plurality of support structures comprise polymers that are laterally spaced apart from a closest one of the plurality of bonding structures. The copper post extends vertically past top surfaces of the first plurality of support structures facing the first die.

In yet some other embodiments, the present disclosure relates to a three dimensional integrated chip (3DIC) structure. The 3DIC structure comprises a first die and a second die that is bonded to the first die by one or more bonding structures. A first plurality of support structures are disposed between the first die and the second die. The first plurality of support structures are comprise polymers laterally spaced apart from a closest one of the one or more bonding structures. The first plurality of support structures directly contact a surface of the second die that comprises a semiconductor material.

Various modifications, changes, and variations apparent to those of skill in the art may be made in the arrangement, operation, and details of the methods and systems disclosed. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. An integrated circuit, comprising:
a first semiconductor die above a first conductive pad;
a second semiconductor die below a second conductive pad;
one or more bonding structures respectively comprising one or more conductive materials that continuously extend between the first conductive pad and the second conductive pad, wherein the one or more bonding structures have a first height;
a first plurality of support structures disposed between the first semiconductor die and the second semiconductor die, wherein the first plurality of support structures are spaced apart from the one or more bonding structures, are configured to hold together the first semiconductor die and the second semiconductor die, and have a second height that is less than the first height; and
a passivation layer directly covering a bottom surface of the first conductive pad and having a bottommost surface that contacts uppermost surfaces of the first plurality of support structures.

2. The integrated circuit of claim 1, wherein the one or more bonding structures extend past the first plurality of support structures along a first direction and along a second direction perpendicular to the first direction in a top-view of the integrated circuit.

3. The integrated circuit of claim 1, wherein one or more of the first plurality of support structures are surrounded by the one or more bonding structures along a first direction and along a second direction perpendicular to the first direction in a top-view of the integrated circuit.

4. The integrated circuit of claim 1, wherein the passivation layer directly contacts the bottom surface of the first conductive pad.

5. The integrated circuit of claim 1,
wherein the passivation layer is arranged between the first plurality of support structures and the first semiconductor die, and
wherein the one or more bonding structures respectively comprise a copper post, the passivation layer arranged along sidewalls of the copper post.

6. The integrated circuit of claim 1,
wherein the passivation layer separates the first plurality of support structures from the first semiconductor die, and
wherein a differentiable and continuous function defines a sidewall of the one or more bonding structures that extends from a first position laterally surrounded by the passivation layer to a second position that is between the bottommost surface of the passivation layer and the second semiconductor die.

7. The integrated circuit of claim 1, wherein the first plurality of support structures comprise a polymer configured to soften and melt under reflow of the one or more bonding structures.

8. The integrated circuit of claim 1, wherein the first plurality of support structures respectively have a Young's modulus that is in a range from about 1 GPa (giga pascal) to about 10 GPa.

9. The integrated circuit of claim 1, wherein a first distance between a top of the first plurality of support structures and a substrate of the first semiconductor die is larger than a second distance between a bottom of the first plurality of support structures and a substrate of the second semiconductor die.

10. A method of forming an integrated circuit, comprising:
providing a first die having a first connecting structure and a support structure;
providing a second die having a second connecting structure;
bringing the first connecting structure into contact with the second connecting structure; and
heating the first connecting structure and the second connecting structure after bringing the first connecting structure into contact with the second connecting structure, wherein heating the first connecting structure and the second connecting structure performs a reflow process that forms a bonding structure from the first connecting structure and the second connecting structure, and wherein the support structure begins to adhere to the second die during the heating of the first connecting structure and the second connecting structure.

11. The method of claim 10, wherein the first connecting structure comprises a solder layer and a copper post.

12. The method of claim 11, wherein the reflow process shortens a height of the solder layer to bring the support structure into contact with the second die so that the support structure adheres to both the first die and the second die.

13. The method of claim 10,
wherein the second die is separated from the support structure by a non-zero distance before the reflow process; and
wherein a height of the first connecting structure is reduced during the reflow process so that the support structure is brought into contact with the second die during the reflow process.

14. The method of claim 10, wherein the reflow process bonds the support structure to the second die.

15. The method of claim 10, wherein the first die further comprises:
a passivation layer arranged between the support structure and the first die, wherein the passivation layer is arranged along sidewalls of the first connecting structure.

16. A method of forming an integrated circuit, comprising:
providing a first die having a first connecting structure and a support structure;
providing a second die having a second connecting structure;
bringing the first connecting structure into contact with the second connecting structure;
increasing temperatures of the first connecting structure and the second connecting structure, after bringing the first connecting structure into contact with the second connecting structure, to form a bonding structure from the first connecting structure and the second connecting structure, wherein increasing the temperatures of the first connecting structure and the second connecting structure reduces heights of the first connecting structure and the second connecting structure and brings the support structure into contact with the second die; and
wherein the support structure is configured to exert a force that holds together the first die and the second die during a reflow process.

17. The method of claim 16, wherein the support structure begins to adhere to the second die after increasing temperatures of the first connecting structure and the second connecting structure.

18. The method of claim 17, wherein a height of the support structure is maintained at a substantially constant value before and during the increasing of the temperatures of the first connecting structure and the second connecting structure.

19. The method of claim 16, wherein the temperatures of the first connecting structure and the second connecting structure are increased to a peak temperature in a range from about 230° C. to about 250° C.

20. The method of claim 16, wherein a gap exists between the support structure and the second die after bringing the first connecting structure into contact with the second connecting structure.

* * * * *